United States Patent
Whig et al.

(10) Patent No.: US 9,444,037 B2
(45) Date of Patent: Sep. 13, 2016

(54) MAGNETORESISTIVE MEMORY ELEMENT HAVING A METAL OXIDE TUNNEL BARRIER

(71) Applicant: Everspin Technologies, Inc., Chandler, AZ (US)

(72) Inventors: Renu Whig, Chandler, AZ (US); Jason Janesky, Gilbert, AZ (US); Nicholas Rizzo, Gilbert, AZ (US); Jon Slaughter, Tempe, AZ (US); Dimitri Houssameddine, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/043,633

(22) Filed: Feb. 15, 2016

(65) Prior Publication Data

US 2016/0172582 A1    Jun. 16, 2016

Related U.S. Application Data

(63) Continuation of application No. 14/701,831, filed on May 1, 2015, now Pat. No. 9,293,698, which is a continuation of application No. 14/037,087, filed on Sep. 25, 2013, now Pat. No. 9,136,464.

(60) Provisional application No. 61/705,166, filed on Sep. 25, 2012.

(51) Int. Cl.
| | |
|---|---|
| *H01L 43/12* | (2006.01) |
| *H01L 43/02* | (2006.01) |
| *H01L 27/22* | (2006.01) |
| *H01L 43/08* | (2006.01) |
| *H01L 43/10* | (2006.01) |

(52) U.S. Cl.
CPC ............. *H01L 43/02* (2013.01); *H01L 27/222* (2013.01); *H01L 43/08* (2013.01); *H01L 43/10* (2013.01)

(58) Field of Classification Search
CPC ....... H01L 43/08; H01L 43/12; H01L 43/10; H01L 27/222; H01L 29/66984
See application file for complete search history.

(56) References Cited

U.S. PATENT DOCUMENTS

| | | |
|---|---|---|
| 6,347,049 B1 | 2/2002 | Childress et al. |
| 6,841,395 B2 | 1/2005 | Linn et al. |
| 7,239,489 B2 | 7/2007 | Lin et al. |
| 7,480,173 B2 | 1/2009 | Guo et al. |
| 7,488,609 B1 | 2/2009 | Lin et al. |
| 7,598,555 B1 | 10/2009 | Papworth Parkin |
| 7,635,654 B2 | 12/2009 | Sun et al. |
| 7,780,820 B2 | 8/2010 | Zhao et al. |

(Continued)

*Primary Examiner* — Jaehwan Oh

(57) ABSTRACT

A magnetoresistive memory array including a plurality of magnetoresistive memory elements wherein each magnetoresistive memory element comprises a free layer including at least one ferromagnetic layer having perpendicular magnetic anisotropy, a fixed layer, and a tunnel barrier, disposed between and in contact with the free and fixed layers. The tunnel barrier includes a first metal-oxide layer, having a thickness between 1 and 10 Angstroms, a second metal-oxide layer, having a thickness between 3 and 6 Angstroms, disposed on the first metal-oxide layer, and a third metal-oxide layer, having a thickness between 3 and 6 Angstroms, disposed over the second metal-oxide layer. In one embodiment, the third metal-oxide layer is in contact with the free layer or fixed layer. The tunnel barrier may also include a fourth metal-oxide layer, having a thickness between 1 and 10 Angstroms, disposed between the second and third metal-oxide layers.

20 Claims, 3 Drawing Sheets

(56) References Cited

U.S. PATENT DOCUMENTS

| | | | |
|---|---|---|---|
| 8,174,800 B2* | 5/2012 | Tsunekawa | B82Y 10/00 360/324.11 |
| 8,202,572 B2 | 6/2012 | Zhao et al. | |
| 8,216,703 B2 | 7/2012 | Sun et al. | |
| 8,372,661 B2 | 2/2013 | Horng et al. | |
| 8,373,948 B2 | 2/2013 | Zeltser | |
| 9,136,464 B1 | 9/2015 | Whig et al. | |
| 2005/0047027 A1 | 3/2005 | Lin | |
| 2007/0165337 A1 | 7/2007 | Ide et al. | |
| 2008/0232002 A1 | 9/2008 | Mather et al. | |
| 2008/0257714 A1 | 10/2008 | Lin et al. | |
| 2009/0108383 A1 | 4/2009 | Horng et al. | |
| 2009/0250776 A1* | 10/2009 | Takenaga | G11C 11/16 257/421 |
| 2009/0257151 A1 | 10/2009 | Zhang et al. | |
| 2009/0268351 A1* | 10/2009 | Zeltser | B82Y 10/00 360/324.2 |
| 2011/0025320 A1* | 2/2011 | Ohta | G01R 33/091 324/252 |
| 2011/0062537 A1* | 3/2011 | Oh | B82Y 25/00 257/421 |
| 2011/0163743 A1* | 7/2011 | Rodmacq | B82Y 25/00 324/244.1 |
| 2011/0198715 A1* | 8/2011 | Matsuoka | G11C 11/16 257/421 |
| 2011/0233699 A1* | 9/2011 | Takenaga | H01L 27/0207 257/421 |
| 2012/0128870 A1 | 5/2012 | Zhao et al. | |
| 2012/0205758 A1* | 8/2012 | Jan | H01L 29/66984 257/421 |
| 2012/0205762 A1* | 8/2012 | Matsukawa | B82Y 10/00 257/421 |
| 2012/0235258 A1 | 9/2012 | Zhao et al. | |
| 2012/0313191 A1* | 12/2012 | Whig | H01L 43/08 257/421 |
| 2013/0234266 A1 | 9/2013 | Prejbeanu et al. | |
| 2013/0309784 A1* | 11/2013 | Jan | H01L 43/08 438/3 |
| 2014/0306302 A1* | 10/2014 | Jan | H01L 43/10 257/421 |
| 2015/0236253 A1 | 8/2015 | Whig et al. | |

* cited by examiner

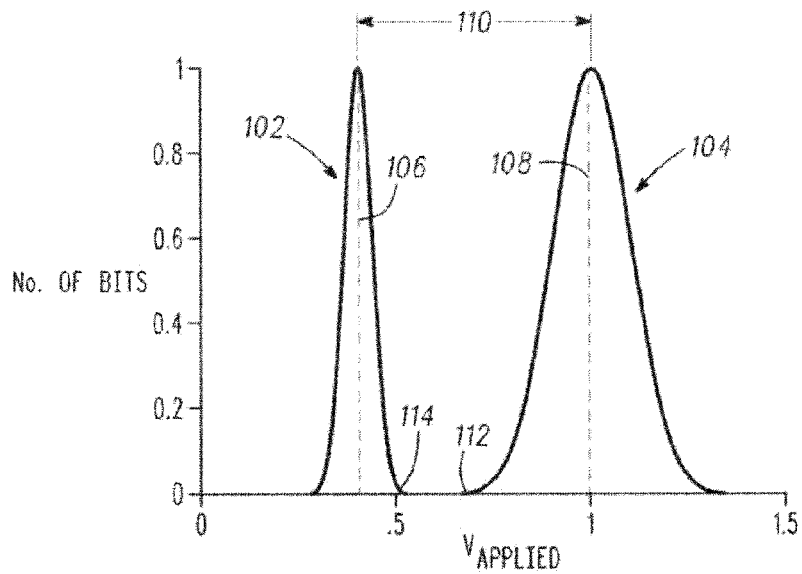
FIG. 1
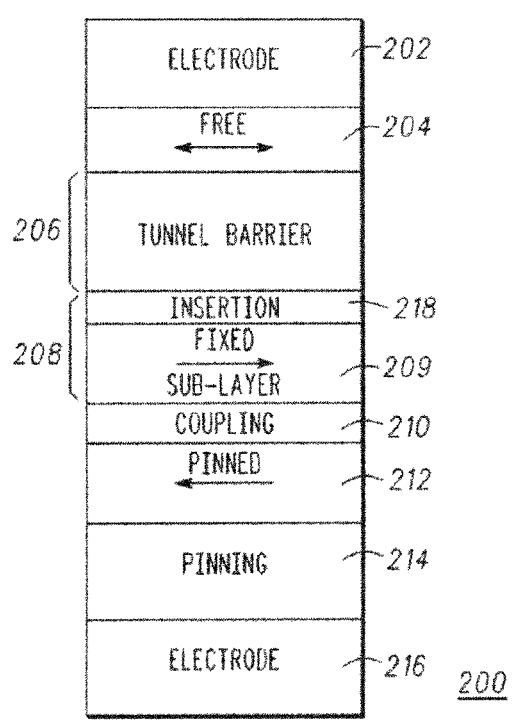
FIG. 2
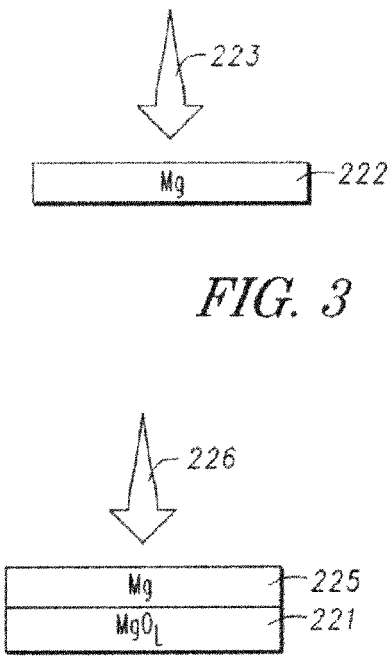
FIG. 3
FIG. 4

MAGNETORESISTIVE MEMORY ELEMENT HAVING A METAL OXIDE TUNNEL BARRIER

CROSS REFERENCE TO RELATED APPLICATION

This application is a continuation of U.S. patent application No. Ser. 14/701,831, filed May 1, 2015 (still pending), which is a continuation of U.S. patent application Ser. No. 14/037,087, filed Sep. 25, 2013 (now U.S. Pat. No. 9,136,464). This application and the '831 and '087 applications claim priority to and the benefit of U.S. Provisional Application No. 61/705,166 filed 25 Sep. 2012. The '831, '087 and '166 applications are hereby incorporated by reference.

TECHNICAL FIELD

The exemplary embodiments described herein generally relate to ST-MRAM and more particularly relate to structures made by, and methods for manufacturing, a metal oxide tunnel barrier for an ST-MRAM.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Generally, an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field-switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The spin angular momentum carried by the spin-polarized tunneling current causes reversal of the free layer, with the final state (parallel or antiparallel) determined by the polarity of the current pulse. Spin-torque transfer is known to occur in MTJ devices and giant magnetoresistance devices that are patterned or otherwise arranged so that the current flows substantially perpendicular to the interfaces and in simple wire-like structures when the current flows substantially perpendicular to a domain wall. Any such structure that exhibits magnetoresistance (MR) has the potential to be a spin-torque magnetoresistive memory element.

Tunnel barrier breakdown is an irreversible degradation in the integrity of the tunnel barrier in an MTJ so that the MR and spin torque reliability are greatly reduced. The critical voltage of the MTJ is the voltage bias across the tunnel barrier at which sufficient spin-polarized current flows across the tunnel barrier so as to reverse the direction of magnetization of the free layer of the MTJ by the spin-torque effect. A tunnel barrier breakdown distribution overlapping a critical voltage distribution and wide distributions may cause errors in the operation of the array. Additionally, a low MR ratio decreases separation between high and low resistance states, causing poor read performance.

Accordingly, it is desirable to provide a structure and method for manufacture that provides improved breakdown distributions, a reduced number of bits with a low breakdown voltage, and a magnetic tunnel junction device having an increased MR. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and structure are provided for manufacture of a MTJ of a ST-MRAM device that provides improved breakdown distributions, a reduced number of bits with a low breakdown voltage, and a magnetic tunnel junction device having an increased magnetoresistance.

A first exemplary embodiment comprises a process for manufacturing a magnetic random access memory element, the process comprising in sequence forming a first ferromagnetic layer comprising one of a fixed layer or a free layer; forming a first metal material over the first ferromagnetic layer; oxidizing at least a first portion of the first metal material to a first oxidation dose; forming a second metal material over the first metal material; oxidizing at least a second portion of the second metal material to a second oxidation dose different than the first dose; forming a third metal material over the second metal material; oxidizing at least a third portion of the third metal material to a third oxidation dose different from the first and second doses; and forming a second ferromagnetic material layer comprising the other of the fixed layer or the free layer over the third metal material.

A second exemplary embodiment comprises a magnetic random access memory element having defects at a density less than 1 defect in 1.5 microns$^2$ and manufactured in the sequential steps comprising forming a first ferromagnetic layer comprising one of a fixed layer or a free layer; forming a first metal material over the first ferromagnetic layer; oxidizing at least a portion of the first metal material to a first oxidation dose; forming a second metal material over the first metal material; oxidizing at least a portion of the second metal material to a second oxidation dose different from the first oxidation dose; forming a third metal material over the second metal material; oxidizing at least a portion of the third metal material to a third oxidation dose different from the first and second oxidation doses; and forming a second ferromagnetic material layer comprising the other of the fixed layer or the free layer over the third metal material.

A third exemplary embodiment comprises a process for manufacturing a magnetic random access memory element, comprising forming a fixed layer between an electrode and a tunnel barrier, comprising forming a first ferromagnetic layer comprising less than or equal to 20%-atomic boron; and forming a second ferromagnetic layer comprising more than 20%-atomic boron between the tunnel barrier and the first ferromagnetic layer.

A fourth exemplary embodiment comprises a magnetic random access memory element, comprising an electrode; a tunnel barrier; and a fixed layer between the electrode and the tunnel barrier, the fixed layer comprising a first ferromagnetic layer comprising less than or equal to 20%-atomic boron; and a second ferromagnetic layer comprising more than 20%-atomic boron between the tunnel barrier and the first ferromagnetic layer.

BRIEF DESCRIPTION OF THE DRAWINGS

The present invention will hereinafter be described in conjunction with the following drawing figures, wherein like numerals denote like elements, and FIG. 1 is a histogram of the number of bits with a given critical voltage and a given breakdown voltage versus applied voltage across the bit for all the bits of an array;

FIG. 2 is a cross section of a bit structure of an ST-MRAM array in accordance with a first exemplary embodiment;

FIGS. 3-5 are cross sections illustrating the steps in manufacturing a tunnel barrier of the ST-MRAM in accordance with the first exemplary embodiment;

DETAILED DESCRIPTION

Figure 5:
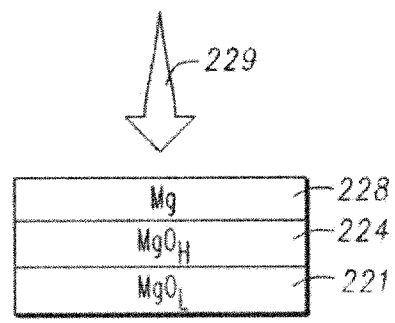

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

The spin-torque effect is known to those skilled in the art. Briefly, a current becomes spin-polarized after the electrons pass through the first magnetic layer in a magnetic/nonmagnetic/magnetic trilayer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of the its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance (MR) is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

In general and in accordance with the exemplary embodiments, a structure and a process for manufacture provides improved breakdown distributions, a reduced number of bits with a low breakdown voltage, and a magnetic tunnel junction device having an increased MR, thereby improving reliability, manufacturability, and error-free operation. A tunnel barrier is formed between a free layer and a fixed layer of a spin-torque magnetic random access memory (ST-MRAM) device. The tunnel barrier is formed in at least six steps comprising at least three repeating steps of forming a metal material, preferably Mg, and oxidizing the metal material. The oxidizing of each metal material is preferably accomplished wherein the first metal material comprises the lowest oxidization, and the second metal material (between the first and third metal materials) comprises the highest oxidization.

An additional exemplary embodiment, in addition to the oxidization process described in the preceding paragraph, comprises forming the fixed layer of two ferromagnetic layers of a metal alloy, preferably cobalt/iron/boron (CoFeB), separated by a discontinuous layer of a transition metal, preferably tantalum (Ta). The Ta layer is of such a thickness as to not interfere with the direct exchange coupling of the ferromagnetic layers on either side thereof.

Referring to FIG. 1, the switching distribution 102 and the breakdown distribution 104 are graphed as the number of bits in the array versus the applied voltage across the bit. For reliable switching, a switching voltage significantly greater than the mean switching voltage 106 in the array must be applied. For a Gaussian distribution of the mean switching voltage 106 for tunnel junction devices in the array, a switching voltage of at least five standard deviations above the mean would be applied. To avoid breakdown of the bits in the array, the mean breakdown voltage 108 must be well separated 110 from the mean switching voltage 106.

Bits with the lowest breakdown voltage 112 will breakdown first in the life of an ST-MRAM array. Manufacturing a tunnel junction device wherein the low point 112 of the breakdown distribution 104 is displaced from the high point 114 of the switching distribution 102 improves reliability and manufacturability. It is known that the bits at the low end of the breakdown distribution 104 are caused by defects that occur at a density of approximately 1 defect in an area of 1.5 microns$^2$. However, this defect density can be substantially reduced with the exemplary embodiments described herein.

During fabrication of the MRAM array architecture, each succeeding layer is deposited or otherwise formed in sequence and each tunnel junction device may be defined by selective deposition, photolithography processing, etching, etc. using any of the techniques known in the semiconductor industry. Typically the layers of the tunnel junction are formed by thin-film deposition techniques such as physical vapor deposition, including magnetron sputtering, ion beam deposition, or thermal evaporation. During deposition of at least a portion of the tunnel junction, a magnetic field is sometimes provided to set a preferred anisotropy easy-axis into the material (induced intrinsic anisotropy). In addition, the tunnel junction stack is typically annealed at elevated temperature while exposed to a magnetic field directed along the preferred anisotropy easy-axis to further set the intrinsic anisotropy direction and to set the pinning direction when an antiferromagnetic pinning layer is used. The provided magnetic field creates a preferred anisotropy easy-axis for a magnetic moment vector in the ferromagnetic materials. In addition to intrinsic anisotropy, memory elements patterned into a shape having aspect ratio greater than one will have a shape anisotropy, and the combination of this shape and the intrinsic anisotropy define an easy axis that is preferably parallel to a long axis of the memory element. In some cases it may be advantageous to employ free layer materials that have a strong perpendicular magnetic anisotropy (PMA) such that the easy axis of the free layer is perpendicular to the film plane and the two stable magnetic states are characterized by a magnetization vector directed generally toward or away from the tunnel barrier. Such PMA materials known in the art include certain ordered L10 alloys such as: FePt, FePd, CoPt, FeNiPt; and certain artificial multilayered structures such as: Co/Pt, Co/Pd, CoCr/Pt, Co/Au, Ni/Co, as well as alloys of CoFeB in combination with interfaces of MgO.

In the case where the free layer magnetization has a strong PMA, the pinned and fixed layers can also be formed with a strong PMA. In order to provide the pinned and fixed layers with a strong PMA, the pinned and fixed layers can be made of any of the PMA materials just described above as possibilities for the free layer. When the pinned and fixed layers have a strong PMA, then an antiferromagnetic pinning layer can be used to pin the pinned and fixed layer magnetizations, or alternately an antiferromagnetic pinning layer may not be used. Also in the case where the fixed layer has a strong PMA, the pinned layer may be omitted, either with or without an antiferromagnetic pinning layer present.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photo resist material is applied onto a layer overlying a wafer substrate. A photo mask (containing clear and opaque areas) is used to selectively expose this photo resist material by a form of radiation, such as ultraviolet light, electrons, or x-rays. Either the photo resist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photo resist as a template.

Although the described exemplary embodiments disclosed herein are directed to various ST-MRAM structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the free and fixed layers in a ST-MRAM structure may be reversed so that the fixed layer is on top and the free layer is below. Also the free layers and the fixed layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

During the course of this description, like numbers may be used to identify like elements according to the different figures that illustrate the various exemplary embodiments.

Because a large number of layers having various materials therein and complex interactions are shown in FIGS. 2-6 and described in the associated text, non-limiting examples of suitable materials for the various layers are included in the drawings figures. This is intended merely for convenience of explanation and to reduce the confusion that might be caused by the reader having to continually refer back and forth between the associated text and the drawing figures in order to keep in mind what kinds of materials are included in each layer for the different embodiments. Accordingly, such illustrations in the drawing figures are provided by way of example to facilitate explanation and are not intended to be limiting.

Shown in FIG. 2, in accordance with an exemplary embodiment, is a magnetic memory element 200 comprising top electrode 202, free ferromagnetic layer 204 immediately under top electrode 202, tunnel barrier 206 immediately under free ferromagnetic layer 204, fixed ferromagnetic layer 208 immediately under tunnel barrier 206, coupling layer 210 immediately under fixed ferromagnetic layer 208, pinned ferromagnetic layer 212 immediately under coupling layer 210, pinning layer 214 immediately under pinned ferromagnetic layer 212, and base electrode 216 immediately under pinning layer 214. An optional insertion layer 218 may be included in the fixed layer 208 at a position located above the fixed sub-layer 209 and immediately under the tunnel barrier 206. While the free ferromagnetic layer 204 is shown as a single layer, those skilled in the art will understand it may comprise several layers, for example, two ferromagnetic layer separated by a coupling layer (not shown). Free, fixed, and pinned ferromagnetic layers 204, 208, and 212 are preferably comprised of alloys that include cobalt and iron, and preferably cobalt, iron, and boron, and have a thickness in the range of 8 Angstroms to 100 Angstroms, and preferably 15 Angstroms to 40 Angstroms. It is also known to those skilled in the art that fixed and pinned ferromagnetic layers 208 and 212, and coupling layer 210 can be replaced by other structures that provide a magnetically fixed or pinned ferromagnetic layer in contact with the tunnel barrier 206, such as a single ferromagnetic layer. As employed herein, the words "fixed" and "pinned" are used equivalently to refer to ferromagnetic layer(s) whose magnetic moment vector does not move substantially in the applied magnetic fields or spin-torque currents used to switch the magnetic moment vector of the free layer and the word "free" is intended to refer to ferromagnetic layers whose magnetic moment does move significantly in response to such applied magnetic fields or spin-torque currents.

Coupling layer 210 preferably comprises ruthenium but can also comprise other coupling materials such as rhodium, rhenium, iridium, and osmium. As used herein, the words "coupling material" and "coupling layer", singular or plural, mean a material that can provide antiferromagnetic coupling between two nearby ferromagnetic materials. Coupling layer 210 is preferably 9 Angstroms in average thickness, and optional insertion layer 218 is preferably deposited to an average thickness of about 5 Angstroms.

Top and bottom electrodes 202 and 216 comprise a metal, for example, tantalum, titanium, or tungsten. The pinning layer 214 comprises an antiferromagnetic alloy such as PtMn or IrMn for example.

In accordance with the exemplary embodiment, the tunnel barrier 206 comprises a metal oxide, preferably magnesium oxide having uniform properties and low defect density. The tunnel barrier layer 206 is produced by multiple cycles of material deposition and oxidation, in accordance with the exemplary embodiments as shown in FIGS. 3-5 with an oxidation dose as indicated by the subscripts "L", "H", and "I", respectively representing low, high, and intermediate, to have a resistance-area product of between 0.1 to 100Ω-μm². The oxidization is accomplished, for example, by using at least one of natural oxidation, exposure to oxygen radicals, an argon and oxygen plasma, and an ion beam. In one embodiment, the oxidation dose is controlled by the combination of the time of exposure to and the pressure of oxygen gas. For other techniques, other parameters well known in the art, such as RF power, can be used to control the dose. Referring to FIG. 3, a metal material 222 is first formed, for example, deposited, and preferably sputtered, on the fixed ferromagnetic layer 208 and oxidized by a first oxidization dose 223 to form a metal oxide 221. Likewise, a metal material 225 is formed on the metal oxide 221 and oxidized (FIG. 4) by a second oxidization dose 226 to form a metal oxide 224. And a metal material 228 is formed on the metal oxide 224 and oxidized (FIG. 5) by a third oxidization dose 229 to form the metal oxide 227. Each of the metal materials 222, 225, and 228 can be deposited with a thickness in the range between 1 to 10 Angstroms and preferably between 3 to 6 Angstroms. The first, second, and third oxidization doses 223, 226, 229 are, respectively, the lowest dose, the highest dose, and an intermediate dose. The second oxidization dose is at least 100 times greater than the first oxidization dose and preferably 1000 times greater. The third oxidization dose may be chosen as required for the desired tunnel-barrier resistance, but is preferably at least 5 times greater than the first oxidization dose and most preferably 10 times greater. In the case that natural oxidation is used as the oxidation method, the partial pressure of oxygen gas during the natural oxidation steps is in the range from $10^{-3}$ torr to $10^{-6}$ torr. By oxidizing the tunnel barrier 206 with the variable doses, narrower breakdown distributions are achieved, the number of bits with low breakdown voltage is reduced, and the MR of the device is increased.

It is noted that while the tunnel barrier 206 is formed using three cycles of material deposition and oxidation, it may be formed using more than three.

The optional ferromagnetic insertion layer 218 may be provided between the tunnel barrier 206 and the fixed sub-layer 209. The optional insertion layer 218, having for example, ferromagnetic materials of iron (Fe) and cobalt (Co), functions magnetically as part of fixed layer 208. While this insertion layer is preferably a cobalt-iron (CoFe) alloy it may also be of other materials instead, such as cobalt (Co) or iron (Fe) or other alloys containing Co or Fe or CoFeX, where X represents a non-magnetic material, such as B, Ta, Zr, Hf or combinations thereof. With the insertion layers being deposited in some cases to sub-atomic thicknesses, the optional insertion layer 218 and fixed sublayer 209 may appear as a single alloyed layer. Thus, it may be difficult to actually distinguish 218 as a separate layer in a finished product.

Figure 6:
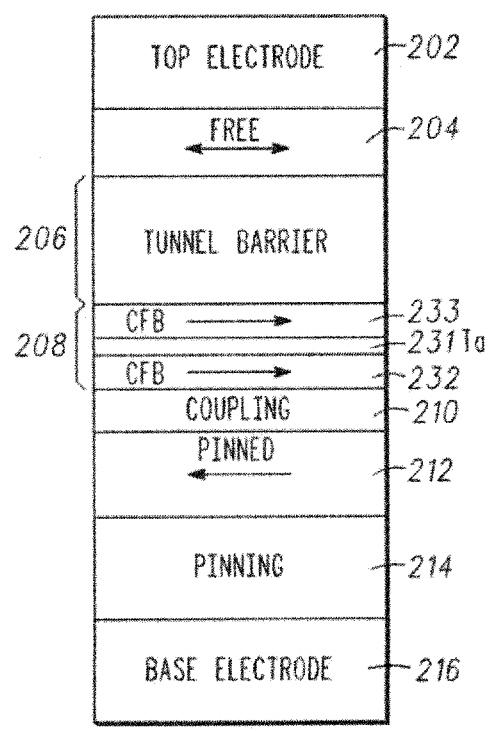
FIG. 6 is a cross section of a bit structure of an ST-MRAM array in accordance with a second exemplary embodiment.

In accordance with another exemplary embodiment, a metal layer 231 comprising, for example, one of the metals tantalum, hafnium, tungsten, niobium, hafnium, titanium, magnesium, vanadium, zinc, and zirconium, but preferably tantalum, is formed between two layers 232, 233 of the fixed layer 208 as shown in FIG. 6. The metal layer 231 preferably is a discontinuous layer of 0 to 5 Angstroms, and more preferably less than 3 Angstroms, in thickness, thereby allowing direct ferromagnetic exchange coupling between the layers 232 and 233. The addition of this metal layer 231 lowers the roughness of the surface of the fixed layer 208, thereby improving seeding of the metal layer 222 formed thereon, and acts as a diffusion barrier to protect the tunnel barrier 206 from diffusing atoms from other layers, resulting in tighter voltage breakdown distributions 104 and a greater magnetoresistance.

When the fixed layer 208 is formed of CoFeB alloys, the ferromagnetic layer 232 immediately under the insertion layer 231 has preferably a low boron content, less than or equal to 20%-atomic, in order to provide a strong antiferromagnetic coupling between the fixed layer 208 and pinned layer 212, and the ferromagnetic layer 233 immediately above the insertion layer 231 has preferably a high boron content, greater than 20%-atomic, in order to achieve narrow breakdown distributions and reduce the number of bits with low breakdown voltage. %-atomic means percentage by atom count.

In the case that the free layer has a strong PMA, the fixed layer may comprise the ferromagnetic layers 232 and 233 separated by the metal layer 231 and with the same boron contents for 232 and 233 as for the case of in-plane free, fixed, and pinned layers, namely that ferromagnetic layer 232 immediately under the metal layer 231 has a low boron content, less than or equal to 20%, and that ferromagnetic layer 233 immediately above the metal layer 231 has a high boron content, greater than 20%. In order to provide strong PMA to the fixed layer 208, the fixed layer may also include an additional layer with strong PMA located at the side of the fixed layer furthest away from the tunnel barrier 206. In the case that the free layer has a strong PMA, any or all of the pinning layer 214, the pinned layer 212, and the coupling layer 210 may be omitted from the stack.

Figure 7:
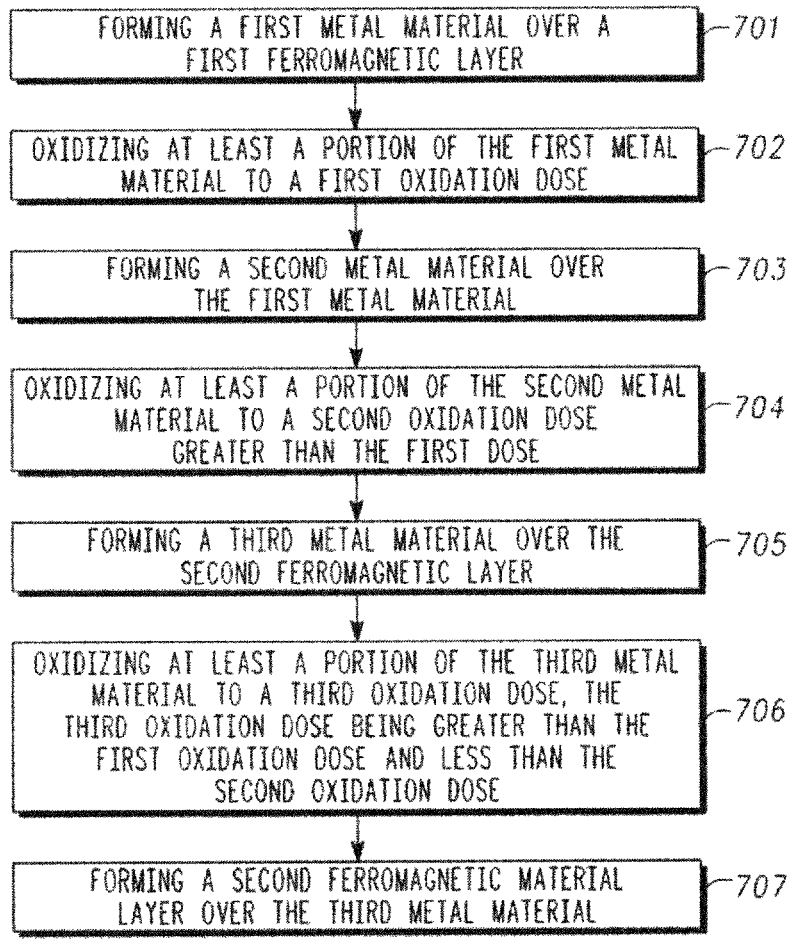
FIG. 7 is a flow chart of the steps for manufacturing the ST-MRAM bit in accordance with the first exemplary embodiment.

FIG. 7 is a flow chart that illustrates an exemplary embodiment of method 700. The various tasks performed in connection with method 700 may be performed by software, hardware, firmware, or any combination thereof. For illustrative purposes, the following description of method 700 may refer to elements mentioned above in connection with other FIGS. In practice, portions of method 700 may be performed by different elements of the described system. It should be appreciated that method 700 may include any number of additional or alternative tasks, the tasks shown in FIG. 7 need not be performed in the illustrated order, and method 700 may be incorporated into a more comprehensive procedure or process having additional functionality not described in detail herein. Moreover, one or more of the tasks shown in FIG. 7 could be omitted from an embodiment of the method 700 as long as the intended overall functionality remains intact.

Referring to the flow chart of FIG. 7, a first metal material is formed 701 over a first ferromagnetic layer and is at least partially oxidized 702 to a first oxidation dose. A second metal material is formed 703 over the first metal and is at least partially oxidized 704 to a second oxidation dose greater than the first dose. A third metal material is formed 705 over the second metal material and is at least partially oxidized 706 to a third oxidation dose greater than the first oxidation dose and less than the second oxidation dose. A second ferromagnetic material layer is formed 707 over the third metal material.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A magnetoresistive memory array including a plurality of magnetoresistive memory elements, wherein each magnetoresistive memory element comprising:
   a free layer including at least one ferromagnetic layer having perpendicular magnetic anisotropy;
   a fixed layer including at least one ferromagnetic layer; and
   a tunnel barrier, disposed between and in contact with the free layer and the fixed layer, the tunnel barrier including:
      a first metal-oxide layer, having a thickness between 1 and 10 Angstroms;
      a second metal-oxide layer, having a thickness between 3 and 6 Angstroms, disposed on the first metal-oxide layer;
      a third metal-oxide layer, having a thickness between 3 and 6 Angstroms, disposed on the second metal-oxide layer; and
      a fourth metal-oxide layer, having a thickness between 1 and 10 Angstroms, disposed over the third metal-oxide layer, wherein the fourth metal-oxide layer is in contact with (i) the at least one ferromagnetic layer of the free layer or (ii) the at least one ferromagnetic layer of the fixed layer.

2. The magnetoresistive memory array of claim 1 wherein the first metal-oxide layer, second metal-oxide layer, third metal-oxide layer and fourth metal-oxide layer are magnesium-oxide layers.

3. The magnetoresistive memory array of claim 1 wherein the first metal-oxide layer has a first resistance-area product, second metal-oxide layer has a second resistance-area product, third metal-oxide layer has a third resistance-area product, and fourth metal-oxide layer has a fourth resistance-area product.

4. The magnetoresistive memory array of claim 1 wherein the first metal-oxide layer includes a first oxidation level, second metal-oxide layer includes a second oxidation level and wherein the second oxidation level is greater than the first oxidation level.

5. The magnetoresistive memory array of claim 1 wherein the third metal-oxide layer includes a third oxidation level and wherein the third oxidation level is greater than the first oxidation level.

6. The magnetoresistive memory array of claim 1 wherein the fourth metal-oxide layer includes a fourth oxidation level and wherein the fourth oxidation level is greater than the first oxidation level.

7. The magnetoresistive memory array of claim 1 wherein the fourth metal-oxide layer includes a fourth oxidation level and wherein the fourth oxidation level is less than the second oxidation level or third oxidation level.

8. A magnetoresistive memory array including a plurality of magnetoresistive memory elements, wherein each magnetoresistive memory element comprising:
   a free layer including at least one ferromagnetic layer having perpendicular magnetic anisotropy;

a fixed layer including at least one ferromagnetic layer; and a tunnel barrier, disposed between and in contact with the free layer and the fixed layer, the tunnel barrier including:
- a first magnesium-oxide layer, having a thickness between 1 and 10 Angstroms, wherein the first magnesium-oxide layer is in contact with the fixed layer;
- a second magnesium-oxide layer, having a thickness between 3 and 6 Angstroms; and
- a third magnesium-oxide layer, having a thickness between 1 and 10 Angstroms, wherein the third magnesium-oxide layer is in contact with the free layer and wherein the second magnesium-oxide layer is disposed between the first and third magnesium-oxide layers.

9. The magnetoresistive memory array of claim 8 wherein the first magnesium-oxide layer has a first resistance-area product, second magnesium-oxide layer has a second resistance-area product, and third magnesium-oxide layer has a third resistance-area product.

10. The magnetoresistive memory array of claim 9 wherein the first resistance-area product is less than the second resistance-area product.

11. The magnetoresistive memory array of claim 9 wherein the third resistance-area product is less than the second resistance-area product.

12. The magnetoresistive memory array of claim 9 wherein the first resistance-area product is less than the third resistance-area product.

13. The magnetoresistive memory array of claim 8 wherein the first magnesium-oxide layer includes a first oxidation level, second magnesium-oxide layer includes a second oxidation level and wherein the second oxidation level is greater than the first oxidation level.

14. The magnetoresistive memory array of claim 8 wherein:
the tunnel barrier is in contact with the at least one ferromagnetic layer of the free layer and wherein the one ferromagnetic layer of the free layer includes iron; and
the tunnel barrier is in contact with the at least one ferromagnetic layer of the fixed layer and wherein the one ferromagnetic layer of the fixed layer is iron.

15. The magnetoresistive memory array of claim 8 wherein:
the tunnel barrier is in contact with the at least one ferromagnetic layer of the free layer or the at least one ferromagnetic layer of the fixed layer, and
the at least one ferromagnetic layer of the free layer or the at least one ferromagnetic layer of the fixed layer is an iron alloy.

16. The magnetoresistive memory array of claim 8 wherein:
the tunnel barrier is in contact with the at least one ferromagnetic layer of the free layer or the at least one ferromagnetic layer of the fixed layer, and
the at least one ferromagnetic layer of the free layer or the at least one ferromagnetic layer of the fixed layer is a cobalt-iron-boron alloy.

17. A magnetoresistive memory array including a plurality of magnetoresistive memory elements, wherein each magnetoresistive memory element comprising:
a free layer including at least one ferromagnetic layer having perpendicular magnetic anisotropy;
a fixed layer including at least one ferromagnetic layer; and
a tunnel barrier, disposed between and in contact with the free layer and the fixed layer, the tunnel barrier including:
- a first magnesium-oxide layer, having a thickness between 1 and 10 Angstroms and a first resistance-area product;
- a second magnesium-oxide layer, having a thickness between 3 and 6 Angstroms and a second resistance-area product, disposed over the first magnesium-oxide layer; and
- a third magnesium-oxide layer, having a thickness between 3 and 6 Angstroms, disposed over the second magnesium-oxide layer, wherein the third magnesium-oxide layer is in contact with (i) the free layer or (ii) the fixed layer.

18. The magnetoresistive memory array of claim 17 wherein the first resistance-area product is less than the second resistance-area product.

19. The magnetoresistive memory array of claim 18 wherein the first resistance-area product is less than the resistance-area product of the third magnesium-oxide layer.

20. The magnetoresistive memory array of claim 18 wherein the resistance-area product of the third magnesium-oxide layer is less than the second resistance-area product.

* * * * *